United States Patent [19]
Hattori et al.

[11] Patent Number: 5,164,762
[45] Date of Patent: Nov. 17, 1992

[54] IMAGE FORMING APPARATUS FOR FORMING AN IMAGE ON A PRESSURE-DEFORMABLE MATERIAL

[75] Inventors: Yasuhiro Hattori; Yoshiyasu Honma, both of Nagoya, Japan

[73] Assignee: Brother Kogyo Kabushiki Kaisha, Nagoya, Japan

[21] Appl. No.: 822,659

[22] Filed: Jan. 21, 1992

[30] Foreign Application Priority Data

| Jan. 19, 1991 | [JP] | Japan | 3-4774 |
| May 8, 1991 | [JP] | Japan | 3-133498 |
| May 16, 1991 | [JP] | Japan | 3-111698 |
| Jun. 18, 1991 | [JP] | Japan | 3-145759 |

[51] Int. Cl.$^5$ .................. G03B 27/32; G03B 27/52
[52] U.S. Cl. ............................... 355/27; 355/77
[58] Field of Search .......... 355/27, 77, 245, 259, 355/277; 430/138; 118/625, 644, 656

[56] References Cited

U.S. PATENT DOCUMENTS

| 4,933,708 | 6/1990 | Asano et al. | 355/27 X |
| 4,985,727 | 1/1991 | Sakai et al. | 355/27 |
| 5,038,710 | 8/1991 | Kagayama et al. | 355/259 |
| 5,043,757 | 8/1991 | Sakai | 355/27 |
| 5,060,011 | 10/1991 | Yamamoto et al. | 355/27 |
| 5,083,151 | 1/1992 | Honma | 355/27 |
| 5,089,844 | 2/1992 | Sakai | 355/27 |
| 5,099,271 | 3/1992 | Maeda et al. | 355/27 |
| 5,099,272 | 3/1992 | Kagayama | 355/27 |

Primary Examiner—Richard A. Wintercorn
Attorney, Agent, or Firm—Oliff & Berridge

[57] ABSTRACT

An image forming apparatus for forming an image on a pressure-deformable or pressure-damageable image receiving member, such as corrugated cardboard, using a photosensitive, pressure-sensitive recording medium referred to as a microcapsule sheet which has a surface coated with an immense number of microcapsules encapsulating a chromogenic material therein. The microcapsule sheet is exposed to imaging light to form a latent image thereon. A developing agent is deposited on the latent image formed portion of the recording medium and a pressure is applied thereto to develop a visible image. The visible image is formed on the microcapsule or another member. In a thermal transfer section, the imaged microcapsule sheet and the image receiving member which are superposed one on the other are heated to transfer the image onto the surface of the image receiving member.

19 Claims, 5 Drawing Sheets

IMAGE FORMING APPARATUS FOR FORMING AN IMAGE ON A PRESSURE-DEFORMABLE MATERIAL

BACKGROUND OF THE INVENTION

1. Field of the Invention

The present invention relates to an image forming apparatus for forming an image on a pressure-deformable image receiving member with the use of a microcapsule sheet and developing agent, wherein the microcapsule sheet carries an immense number of photo-curing or photo-softening microcapsules encapsulating therein chromogenic material or dye, and the developing agent are used to develop an image in accordance with reaction of the chromogenic material released from ruptured microcapsules with the developing agent.

2. Description of the Related Art

It has been proposed a method and an apparatus for forming an image on an image receiving member with the use of a microcapsule sheet and a developing agent. The microcapsule sheet carries on one surface thereof an immense number of microcapsules whose mechanical strength changes dependent on light exposure, thereby forming a latent image thereon. Each microcapsule encapsulates therein a chromogenic material or dye. The exposed microcapsule sheet and an image receiving member, such as a plain paper, are superposed on one the other with a developing agent sandwitched therebetween, and a pressure is applied thereto to rupture the weaker mechanical strength microcapsules, whereby the chromogenic material released from the ruptured microcapsules reacts with the developing agent and a visible image is produced on the image receiving member. Such an apparatus is disclosed, for example, in Japanese Laid-Open Patent Publication No. 2-14947.

However, in the above-described apparatus, the image receiving member is pressed in the process of forming an image. Therefore, a pressure-deformable material or pressure-damageable material cannot be used as the image receiving member.

SUMMARY OF THE INVENTION

The present invention has been made to solve the above-mentioned problem. Accordingly, it is an object of the present invention to provide a method an apparatus for forming an image on a pressure-deformable or pressure-damageable material.

To achieve the above and other objects, there is provided a method of forming an image on an image receiving member using a photosensitive, pressure-sensitive recording medium having a surface coated with an immense number of microcapsules encapsulating a chromogenic material therein. To form the image, the recording medium is exposed to an imaging light to form a latent image thereon. Then, the latent image formed recording medium and a release medium are superposed one on the other with a developing material sandwitched therebetween. Thereafter, a pressure is applied to the superposed two media to perform pressure development wherein the microcapsules which remained uncured are ruptured and the chromogenic material released from the ruptured microcapsules reacts with the developing material. Consequently, a visible image is produced on the recording medium. The visible image formed face of the recording medium is adhered to the image receiving member using an adhesive material and the recording medium is peeled off from the image receiving member. In this manner, the visible image is transferred onto the image receiving member.

According to another aspect of the invention, there is provided an image forming apparatus for forming an image on an image receiving member using a photosensitive, pressure-sensitive recording medium having a surface coated with an immense number of microcapsules encapsulating a coloring material therein. There are provided an exposure means which exposes the recording medium to an imaging light to form a latent image thereon, and depositing means which deposits powders on the latent image formed recording medium. The depositing means has a conveying means, typically in the form of an endless belt, which conveys the powders to the latent image formed recording medium. The powders are in cooperation with the coloring material to produce a visible image. The powders are typically a developing agent but it may absorption agent, fixing acceleration agent, coloring acceleration agent and adhesive agent depending on the material encapsulated in the microcapsules. There is further provided a pressure developing means which applies a pressure to the latent image formed recording medium and develops the latent image with the aid of the powders deposited thereon. As a result, an image is formed on the recording medium. By appropriately selecting the material of the endless conveyor belt constituting the conveying means, the image can be provided on the surface of the endless conveyor belt. There is further provided a thermal transferring means which thermally transfers the image formed either on the recording medium or the endless conveyor belt to the image receiving member.

The depositing means may electrostatically deposit the powders on the surface of the recording medium. In this case, a second conveying means is provided which conveys another endless belt. The visible image formed in the pressure developing means is electrostatically transferred to the another endless belt and the image thereon is transferred to the image receiving member. In this connection, there is provided a first charging means for charging the powders to a first polarity, and a second charging means for charging the another endless belt to a second polarity opposite the first polarity.

The above and other objects, features and advantages of the present invention will become more apparent from the following description when taken in conjunction with the accompanying drawings in which preferred embodiments of the present invention are shown by way of illustrative examples.

DETAILED DESCRIPTION OF THE PREFERRED EMBODIMENTS

In the various embodiments to be described below, a microcapsule sheet is used for forming an image. The microcapsule sheet is photosensitive and pressure-sensitive. More specifically, the microcapsule sheet is made of a substrate whose thickness is about 20 microns. The surface of the substrate is coated with an immense number of photosensitive microcapsules encapsulating a chromogenic material therein. The microcapsule is photocured when exposed to light, therefore, a latent image can be formed thereon upon exposure of imaging light. In conjunction with the microcapsule sheet, a developing agent in the form of powder is used to develop the latent image.

Figure 1:
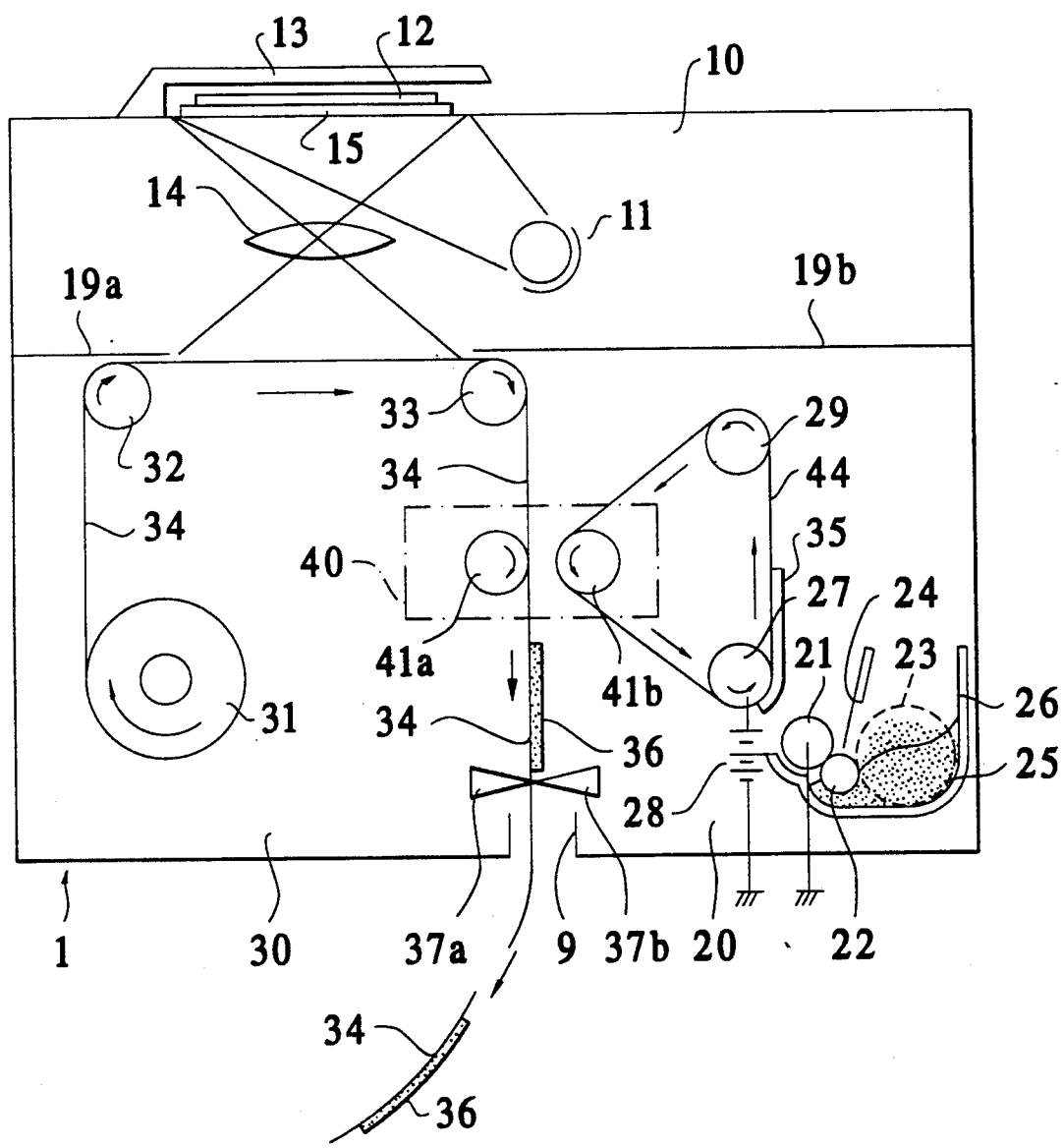
FIG. 1 is a schematic diagram showing an apparatus for producing image-formed microcapsule sheets according to a first embodiment of the present invention.

A first embodiment of the present invention will be described with reference to FIGS. 1 and 2(a) through 2(d). FIG. 1 a vertical cross-sectional view of an apparatus for producing imaged microcapsule sheets. The imaged microcapsule sheet produced from the apparatus of FIG. 1 is manually affixed to an image receiving member as illustrated in FIGS. 2(a) through 2(d).

As shown in FIG. 1, the apparatus 1 is basically comprised of an exposure section 10 provided in the upper portion of the apparatus 1, a microcapsule sheet transportation section 30 provided in the leftside lower portion of the apparatus 1, a developing agent coating section 20 provided in the rightside lower portion of the apparatus 1, and a pressure developing section 40 provided in the center portion of the apparatus 1.

The exposure section 10 includes an exposure lamp 11, such as a halogen lamp, extending in a direction perpendicular to the sheet of drawing, a cover 13 for covering an original document 12 placed on an original support pane 15, a converging lens 14, and light shielding plates 19a, 19b provided for light shielding the microcapsule sheet transportation section 30. The microcapsule sheet transportation section 30 includes a cartridge 31 containing an elongated, web-like microcapsule sheet 34 in a rolled state, feed rollers 32, 33 for feeding the microcapsule sheet 34, and a cutter 37a, 37b for cutting the microcapsule sheet 34.

The developing agent coating section 20 includes a release medium 44 in the form of an endless belt for conveying and transferring a developing agent onto the microcapsule sheet 34, a drive roller 29 for circulating the release medium 44, an electrode roller 27 which is electrically connected to a power supply 28, and a developing agent coating unit 26. The release medium 44 is made up of a substrate whose surface is coated with a material having excellent releasing or parting property, such as fluororesion including polytetrafluoroethylene known as Teflon (registered Trade Mark), silicon-resin or nylon.

The developing agent coating unit 26 includes a developing agent carrying roller 21 which is grounded and carries the developing agent on its peripheral surface, a supply roller 22 for relaying the developing agent to the roller 21, an agitator 23 for agitating the developing agent, and a regulating member 24 for regulating an amount of the developing agent carried on the roller 21.

The pressure developing section 40 is made up of a pair of pressure rollers 41a, 41b. The microcapsule sheet 34 and the release medium 44 are passed through a nip between the pressure rollers 41a, 41b.

In operation, in accordance with rotations of the microcapsule sheet cartridge 31 and the feed roller 32, the unexposed portion of the microcapsule sheet 34 is brought to a position beneath the exposure section 10. In this condition, the exposure lamp 11 is turned on to irradiate light onto the image face of the original document 12. The light reflected from the original document 12 is focused by the converging lens 14 and projected onto the microcapsule sheet 34, whereby a latent image corresponding to the image of the original document is formed on the microcapsule sheet 34. The microcapsule sheet 34 is then moved toward the pressure developing section 40.

In the developing agent coating section 20, the agitator 23 and the rollers 21, 22 are rotated so as to cause the charged developing agent to transferred onto the peripheral surface of the roller 21. Due to an electric field developed between the rollers 21 and 27, the developer agent is electrostatically attracted toward the roller 27. As a consequence, the developing agent is coated on the surface of the release medium 44 passing between the rollers 21 and 27.

The release medium 44 is circulated in counterclockwise direction in accordance with the rotations of the drive roller 29 and the electrode roller 27 so that the developer agent coated portion is fed into the pressure developing section 40. In the pressure developing section 40, the latent-image formed microcapsule sheet 34 and the developer agent coated release medium 44 pass through a nip between the pressure rollers 41a, 41b to press the sheet 34 and the medium 44 against each other. The microcapsules which remain uncured are ruptured and the chromogenic material is released from the ruptured microcapsules. The chromogenic material reacts with the developing agent, thereby forming a visible image 36. Since the releasing property of the release medium 44 is higher than that of the microcapsule sheet 34, the visible image 36 is held on the surface of the microcapsule sheet 34. The microcapsule sheet 34 is further advanced to pass through the cutter 37a, 37b where a portion of the microcapsule sheet 34 on which the visible image is formed is cut away and the cut microcapsule sheet 34 is discharged out of the apparatus 1 through a discharge port 9.

Figure 2A:
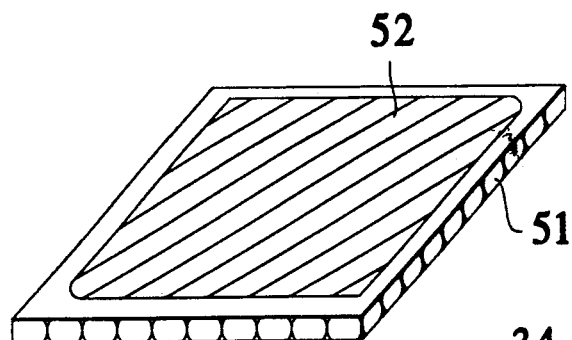
FIGS. 2(a) through 2(d) are explanatory diagrams describing a method of affixing an image-formed microcapsule sheet to an image receiving member.

Next, referring to FIGS. 2(a) through 2(d), a process of transferring the image held on the microcapsule sheet 34 onto an image receiving medium will be described. Assuming that a corrugated cardboard 51 is selected as the image receiving member, the user coats an adhesive material over the surface of the corrugated cardboard 51 to form an adhesive layer 52 as shown in FIG. 2(a). Depending on the adhesive material used, the adhesive coated corrugated cardboard 51 is left as it is for a while to dry it to some extent.

Figure 2B:
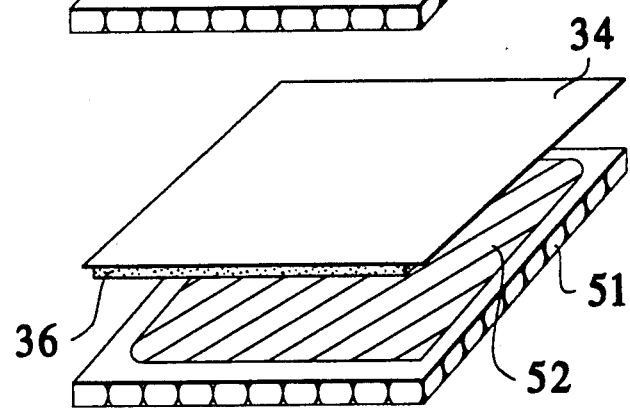
Figure 2C:
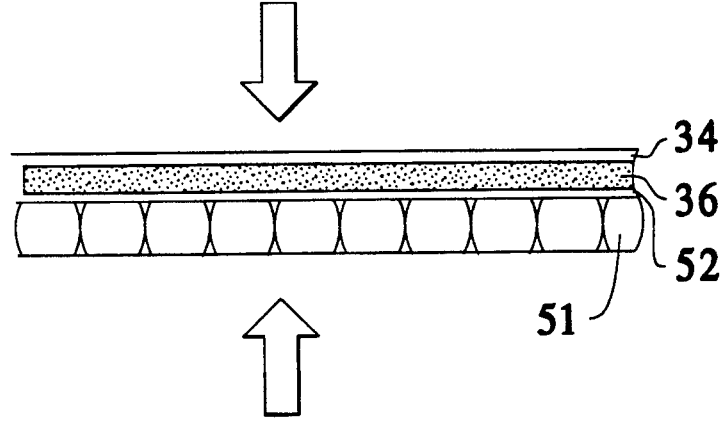
Figure 2D:
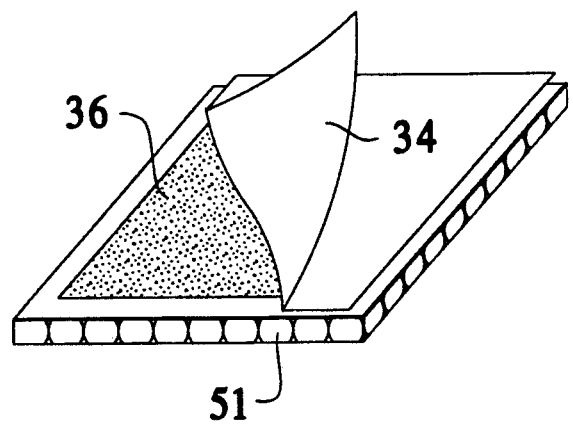

Next, as shown in FIG. 2(b), the microcapsule sheet 34 is superposed on the corrugated cardboard 51 so that the image face on the microcapsule sheet 34 is brought into facial contact with the adhesive layer 52 on the corrugated cardboard 51. Then, as shown in FIG. 2(c), a pressure is applied to the superposed two sheets while placing the corrugated cardboard 51 face down on a rigid flat board, such as a desk. It is preferred to use a baren for pressing the rear side of the microcapsule sheet 34 against the corrugated cardboard 51. Thereafter, as shown in FIG. 2(d), the microcapsule sheet 34 is peeled off from the image receiving member 51. Since the image portion 36 is firmly affixed to the adhesive layer 52, the image is now transferred to the image receiving member 51.

While in the foregoing description, the corrugated cardboard is taken as an example of the image receiving member, other materials are also available for the image receiving member insofar as an adhesive layer can be formed thereon, such as plastic, ceramics, glass. Further, the release medium may not be deposited with the developing agent by virtue of electrostatic attraction but be deposited by spraying a liquid-phase developing agent onto the release medium.

Figure 3:
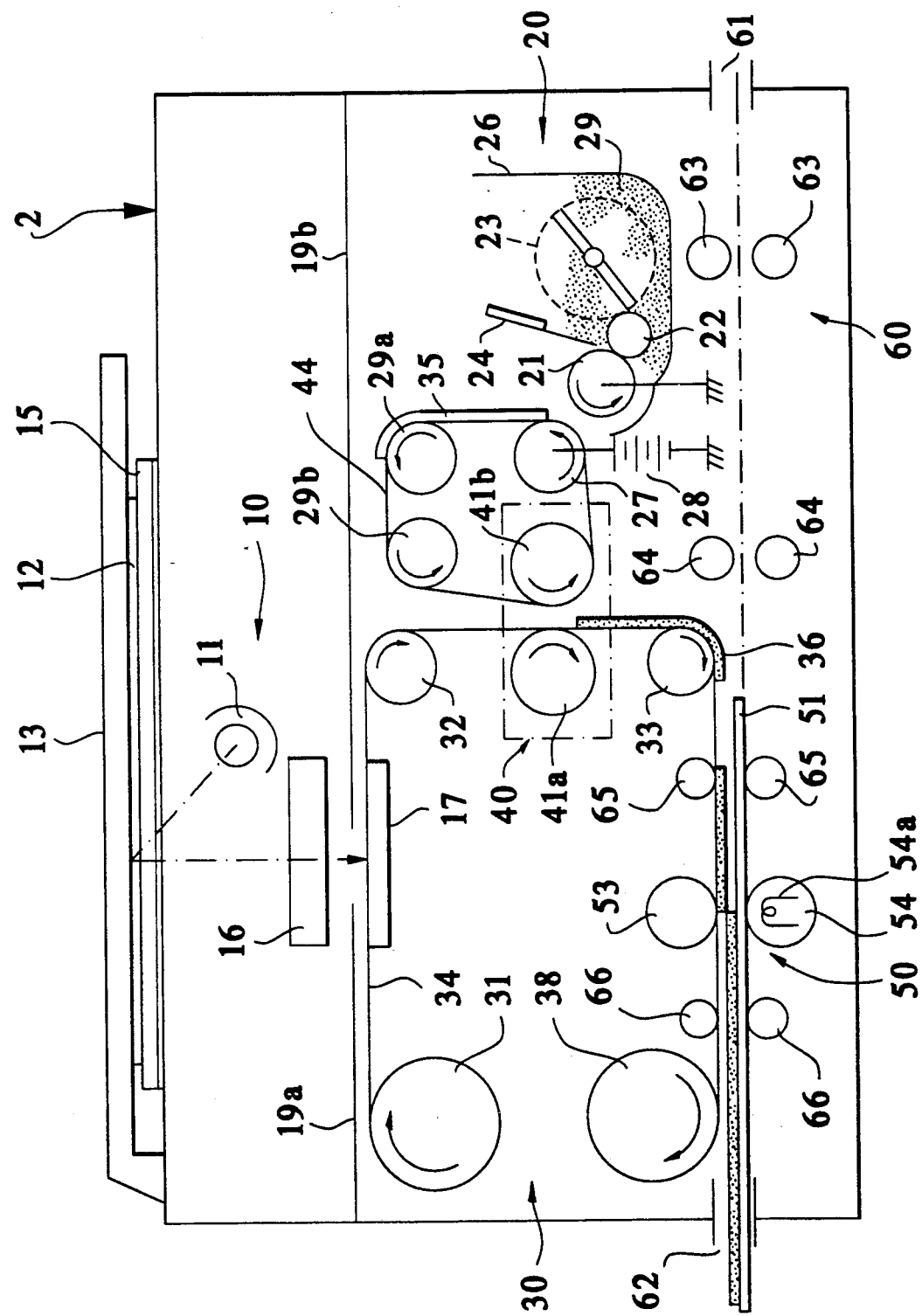
FIG. 3 is a schematic diagram showing an image forming apparatus according to a second embodiment of the present invention.

A second embodiment of the present invention will be described with reference to FIG. 3. FIG. 3 is a vertical cross-sectional view showing an image forming apparatus 2. The apparatus 2 is similar to that shown in FIG. 1. The same reference numerals used in FIGS. 1 and 3 denote the same or the corresponding components or sections, and the description thereof is omitted herein.

Like the apparatus shown in FIG. 1, the apparatus 2 includes an exposure section 10, a microcapsule sheet transportation section 30, a developing agent coating section 20, and a pressure developing section 40. The apparatus 2 further includes an image receiving member transportation section 60 provided in the lower portion of the apparatus 2, and a thermal transfer section 50 provided in a downstream side of the transportation section 60.

An original support pane 15 is reciprocally movably provided in the upper surface of the apparatus 2 for placing an original document 12 thereon. Beneath the original support pane 15, there is provided a filter 16 for adjusting a color balance of the reproduced image. Beneath the filter 16, an exposure table 17 is disposed for placing a microcapsule sheet 34 thereon.

The microcapsule sheet transportation section 30 includes a supply cartridge 31 containing an elongated, web-like microcapsule sheet 34 in rolled state, a takeup cartridge 38 for winding the used microcapsule sheet 34 therearound, and feed rollers 32 and 33. The microcapsule sheet 34 released from the supply cartridge 31 is extended to pass the exposure table 17 and then its moving direction is downwardly oriented by virtue of the feed roller 32 so as to pass through the pressure developing section 40. After passing through the pressure developing section 40, the moving direction of the microcapsule sheet 34 is oriented by virtue of the feed roller 33 to move in the leftward direction so that the microcapsule sheet 34 is introduced into the thermal transfer section 50. The microcapsule sheet 34 passed through the thermal transfer section 50 is wound around the takeup cartridge 38.

A release medium 44 in the form of an endless belt is stretched by an electrode roller 27, a drive roller 29a, a driven roller 29b and a pressure roller 41b in the pressure developing section 40. The release medium 44 is circulated counterclockwise in accordance with the rotations of the drive roller 29a and passes through a nip between the pressure rollers 41a, 41b in the pressure developing section 40. The electrode roller 27 is connected to the positive polarity of a power supply 28 of 1 kilovolt in order to maintain the surface potential of the release medium 44 at the same voltage.

The image receiving medium transportation section 60 includes a plurality of feed roller pairs 63, 64, 65 and 66 which are disposed in spaced apart relation to one another along a path extending from an inport 61 to an outport 62. An image receiving medium 51 is inserted from the inport 61 into the apparatus 2 and conveyed by the feed rollers 63, 64, 65 and 66 and is discharged from the outport 62.

The thermal transfer section 50 including a backup roller 53 and a heat roller 54 is disposed between the two roller pairs 65 and 66. The heat roller 54 has a halogen lamp 54a in the interior thereof, which serves as a heating source. The backup roller 53 and the heat roller 54 are disposed to confront with each other. The microcapsule sheet 34 and the image receiving member 51 are brought into facial contact with each other at a portion beneath the pressure developing section 40 and the superposed two media are fed into a gap between the backup roller 53 and the heat roller 54 so that the microcapsule sheet 34 is in contact with the backup roller 53 and the image receiving medium 51 is in contact with the heat roller 54.

The arrangements of the developing agent coating section 20 and the pressure developing section 40 are exactly the same as those shown in FIG. 1.

In operation, when a switch (not shown) is depressed, the supply cartridge 31 and the takeup cartridge 38 are synchronously driven to move the microcapsule sheet 34. When an unexposed portion of the microcapsule sheet 34 has reached the exposure table 17, the exposure lamp 11 is turned on. Simultaneously, the original support pane 15 on which the original document 12 is placed is moved to scan the original document 12 with the light emitted from the exposure lamp 11. In accordance with the movement of the original support pane 15, the moving microcapsule sheet 34 is exposed to the light reflected from the original document 12 and passed through the filter 16. As a consequence, a latent image is formed on the microcapsule sheet 34. The microcapsule sheet 34 is further moved to enter into the pressure developing section 40 where a visible image is formed on the microcapsule sheet 34.

The imaged microcapsule sheet 34 is further moved toward the thermal transfer section 50. In synchronism with the movement of the microcapsule sheet 34, the image receiving medium 51 is inserted into the interior of the apparatus 2 from the inport 61 and is also moved toward the thermal transfer section 50 by virtue of the feed rollers 63, 64. Beneath the pressure developing section 40, the imaged microcapsule sheet 34 and the image receiving member 51 are brought into facial contact with each other and the superposed two media are introduced into the gap between the backup roller 53 and the heat roller 54 in the thermal transfer section 50. At this time, the halogen lamp 54a of the heat roller 54 is turn on to generate heat. Due to the heat radiation from the halogen lamp 54a, the image 36 on the microcapsule sheet 34 is softened or otherwise melted. The softened or melted image 36 is adhered to the image receiving member 51 according to a difference in surface energy potential between the microcapsule sheet 34 and the image receiving member 51. Specifically, the image 36 is peeled off from the surface of the microcapsule sheet 34 and is transferred onto the surface of the image receiving member 51 as a result of the heat radiation. The image formed image receiving member 51 is then discharged out of the apparatus 2 from the outport 62 while being conveyed by the rollers 66. The microcapsule sheet 34, on the other hand, is wound around the takeup cartridge 38.

In the second embodiment, although the developing agent is relayed to the microcapsule sheet 34 by the release medium 44, the developing agent may be directly applied to the surface of the microcapsule sheet 34. In such a case, the release medium 44 and its associated rollers can be dispensed with.

Figure 4:
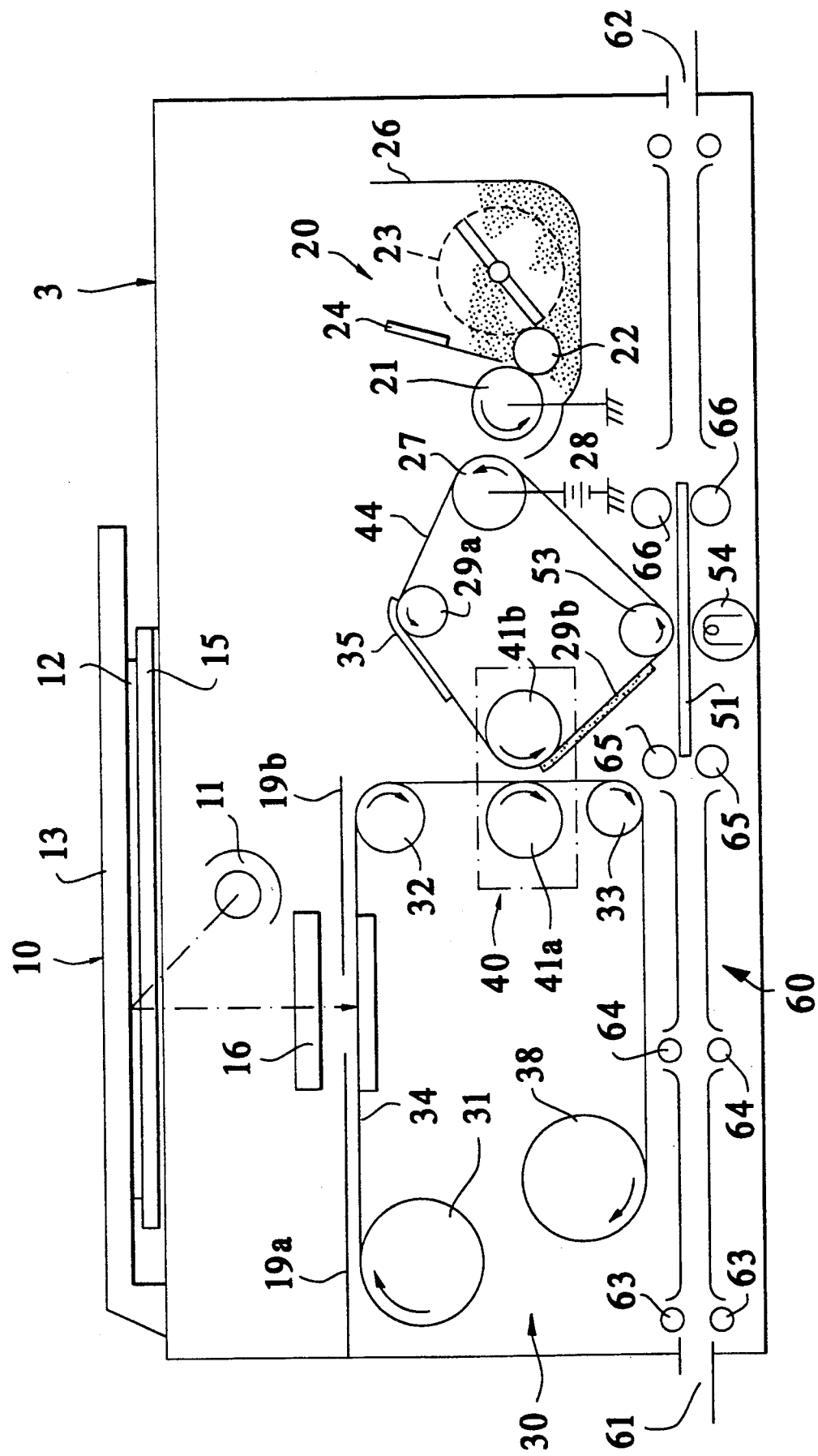
FIG. 4 is a schematic diagram showing an image forming apparatus according to a third embodiment of the present invention.

A third embodiment of the present invention will be described with reference to FIG. 4. An image forming apparatus 3 shown in FIG. 4 is similar to that shown in FIG. 3. The same reference numerals used in FIGS. 3 and 4 denote the same or the corresponding components or sections, and the description thereof is omitted herein.

In the apparatus 3, reference numeral 44 designate an intermediate belt which is made up of a substrate whose surface is coated with a material having a lower releasing or parting property than a microcapsule sheet 43.

A visible image developed in a pressure developing section 40 is adhered to the surface of the intermediate belt 44 due to a difference in surface energy potential or surface roughness between the microcapsule sheet 43 and the intermediate belt 44. After the pressure development, the intermediate belt 44 is circulated by a drive roller 29a, and the image portion 29b on the intermediate sheet 44 is moved downwardly.

An image receiving member 51 is supplied from an inport 61 formed in the leftside wall of the housing, and is conveyed rightwardly toward an outport 62 formed in the rightside wall of the housing. After the image is thermally transferred onto the image receiving member 51 in a thermal transfer section 50, the image formed image receiving member 51 is discharged out of the apparatus through the outport 62.

Figure 5:
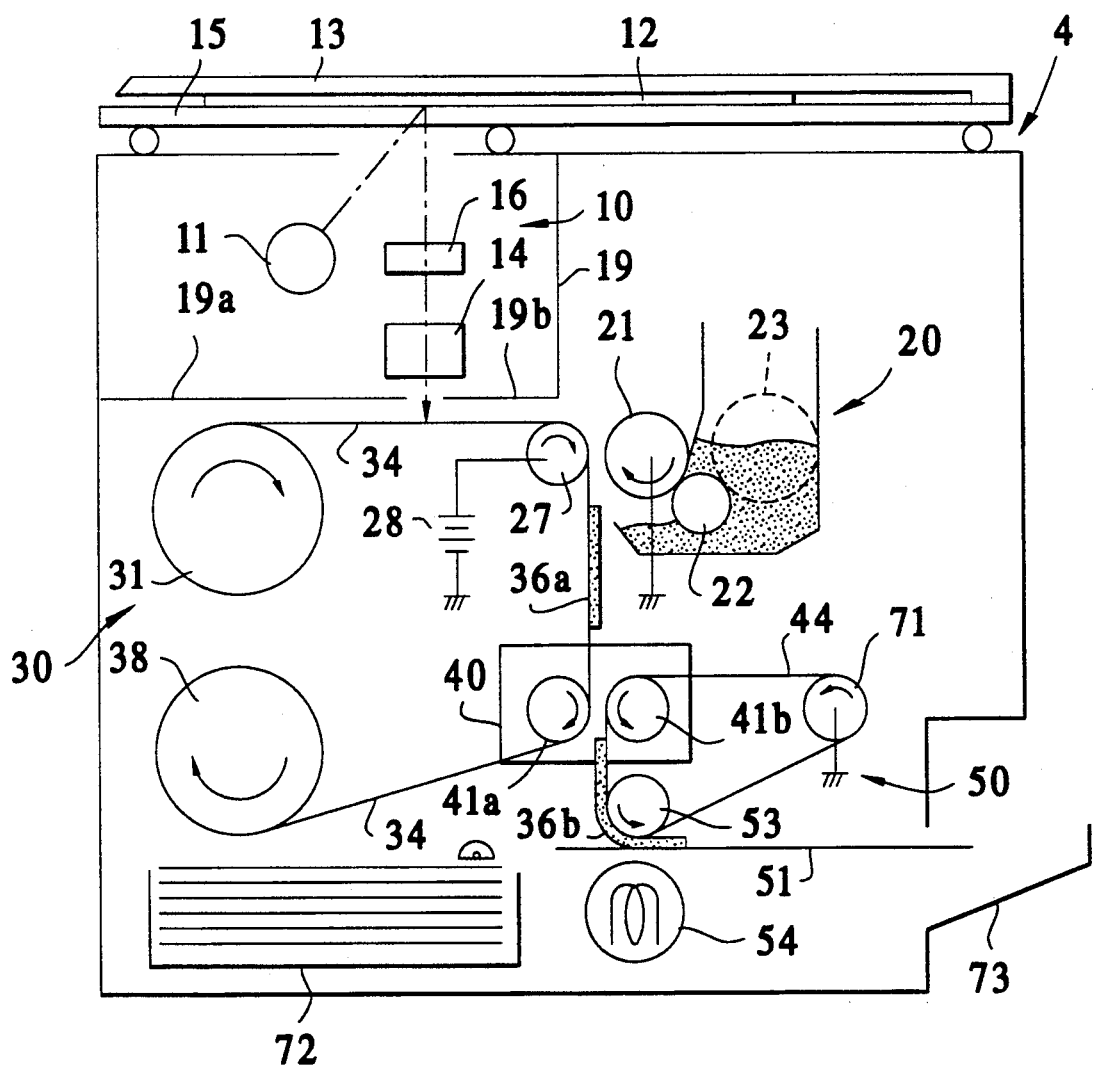
FIG. 5 is a schematic diagram showing an image forming apparatus according to a fourth embodiment of the present invention.

Finally, referring to FIG. 5, a fourth embodiment of the present invention will be described. The same reference numerals used in FIG. 5 denote the same or the corresponding components or sections of the apparatuses shown in FIG. 3 or 4, and the description thereof is omitted herein.

A transfer section 50 is provided in the lower portion of the apparatus 4, for conveying and transferring an image onto an image receiving member 51. The section 50 includes an electrically grounded metal-made roller 71, a pressure roller 41b, a backup roller 53, a transferring medium 44 in the form of an endless belt stretched by the rollers 71, 41b, 53, and a heat roller 54. The heat roller 54 contains a halogen lamp or a heat generating element in the interior thereof. The heat roller 54 and the backup roller 53 are disposed in confronting relation to each other with a gap therebetween allowing the image receiving member 51 to pass therethrough. The transferring medium 44 is made of a polyamide resin, polyacetals resin, or acrylic resin which can easily be charged to a positive polarity.

In the leftside lower portion of the apparatus 4, there is provided a cassette 72 storing a stack of image receiving members 51 in the form of a cut sheet. The uppermost image receiving member 51 is fed out by a sector roller toward the transfer section 50. A sheet receiving tray 73 is formed in the rightside lower portion of the apparatus 4 for receiving the imaged materials therein.

In operation, after the latent image is formed on the microcapsule sheet 34 in the exposure section 10, the exposed portion of the microcapsule sheet 34 passes between the rollers 21 and 27 while being supported by an electrode roller 27.

In a powder coating section 20, an agitator 23 and a supply roller 22 are rotated so as to transfer the powders to the roller 21. The powders are negatively charged because triboelectricity is generated resulting from a frictional contact of the rollers 22 and 21. Due to an electric field developed between the roller 21 and the electrode roller 27, the negatively charged powders are electrostatically attracted toward the electrode roller 27, whereby a powder layer 36a is deposited above the exposed portion of the microcapsule sheet 34. The microcapsule sheet 34 deposited with the powder layer 36a is moved to enter into a pressure developing section 40.

In the transfer section 50, the transferring medium 44 is being circulated in the counterclockwise direction by virtue of the rollers 71, 41b, and 53. The transferring medium 44 is positively charged partly because the transferring medium 44 is being in frictional contact with the periphery of the metal-made and grounded roller 71 and partly because the transferring medium 44 is made of a material which is easily charged to a positive polarity, such as a polyamide resin.

In the pressure developing section 40, the microcapsule sheet 34 and the transferring medium 44 are pressed against each other by a pair of pressure rollers 41a, 41b. The microcapsules which remain uncured are ruptured and the chromogenic material released from the ruptured microcapsules percolates through the powder layer 36a, thereby forming a visible image 36b. The visible image 36b primarily made of powders is negatively charged. Therefore, the image 36b is electrostatically attracted toward the positively charged transferring medium 44. As a consequence, the image 36b is transferred onto the transferring medium 44 and conveyed to a gap between the heat roller 54 and the backup roller 53.

The image receiving member 51 is fed out from the cassette 72 and is also conveyed to the gap between the heat roller 54 and the backup roller 53. The transferring medium 44 and the image receiving member 51 are heated by the heat roller 54, with the result that the image 34b is transferred onto the image receiving member 51. The image formed image receiving member 51 is further conveyed rightwardly and discharged onto the receiving tray 73.

In the fourth embodiment described above, the powder layer 36a may be deposited on the transferring medium rather than depositing on the microcapsule sheet. To this end, it is necessary that the electrically grounded roller 71 be replaced with an electrode roller, and further the powder coating section 20 be positioned to confront the electrode roller provided in place of the roller 71.

In the second, third and fourth embodiments described above, the thermal transfer section 50 may be modified so that the arrangements of backup roller 53 and the heat roller 54 may be reversed so that the heat roller 54 contacts the microcapsule sheet 34 or the transferring medium 44 to heat the latter. Alternatively, both the microcapsule sheet 34 or the transferring medium 44 and the image receiving member 51 may be heated with the provision of two heat rollers.

The microcapsule sheet may be such that dye or pigment is encapsulated in the microcapsules in stead of the chromogenic material. In this connection, absorption agent, fixing acceleration agent, coloring acceleration agent or adhesive agent in the form of powder may be used in stead of the developing agent inasmuch as they contribute to the formation of the visible image in cooperation with the material encapsulated in the microcapsules.

According to the present invention, an image can be formed on a plate-like member made of various kinds of materials, such as, plastic, ceramics, glass, which tend to be damaged when pressure is applied thereto, or corrugated cardboard or fabric which tend to be deformed when pressure is applied thereto.

What is claimed is:

1. A method of forming an image on an image receiving member using a photosensitive, pressure-sensitive recording medium having a surface coated with an immense number of microcapsules encapsulating a chromogenic material therein, comprising the steps of:
    exposing the recording medium to an imaging light to form a latent image thereon;
    superposing the latent image formed recording medium and a release medium one on the other with a developing material sandwitched therebetween and applying a pressure thereto to selectively rupture the microcapsules so that the recording medium carries a visible image resulting from reaction of the chromogenic material released from the ruptured microcapsules with the developing material;
    adhering the visible image formed face of the recording medium to the image receiving member with an adhesive material; and
    peeling off the recording medium from the image receiving member, whereby the visible image is transferred onto the image receiving member.

2. An image forming apparatus for forming an image on an image receiving member using a photosensitive, pressure-sensitive recording medium having a surface coated with an immense number of microcapsules encapsulating a coloring material therein, comprising:
    exposure means for exposing the recording medium to an imaging light to form a latent image thereon;
    depositing means for depositing powders on the latent image formed recording medium, the powders being in cooperation with the coloring material to produce a visible image;
    pressure developing means for applying a pressure to the latent image formed recording medium, and for developing the latent image with the aid of the powders deposited thereon and producing an imaged recording medium having the visible image on the recording medium; and
    thermal transferring means for heating at least one of the imaged recording medium and the image receiving member to transfer the visible image from the recording medium to the image receiving member.

3. The image forming apparatus according to claim 2, wherein said depositing means comprises conveying means for conveying and depositing the powders on the latent image formed recording medium.

4. The image forming apparatus according to claim 3, wherein said conveying means comprises an endless belt partially in surface contact with the recording medium.

5. The image forming apparatus according to claim 4, wherein said endless belt comprises a substrate having a surface, and a material having releasing or parting property stronger than the recording medium, the material being coated on the surface of said substrate.

6. The image forming apparatus according to claim 5, wherein said material coated on the surface of said substrate is a fluororesion.

7. The image forming apparatus according to claim 5, wherein said material coated on the surface of said substrate is a silicon-resin.

8. The image forming apparatus according to claim 2, wherein said coloring material is a chromogenic material and said powders are developing agent reactable with the chromogenic material.

9. The image forming apparatus according to claim 2, wherein said coloring material is a dye and said powders are any one of dye absorption agent, dye fixing acceleration agent, coloring acceleration agent and adhesive agent.

10. The image forming apparatus according to claim 2, wherein said coloring material is a pigment and said powders are any one of pigment absorption agent, pigment fixing acceleration agent, coloring acceleration agent and adhesive agent.

11. An image forming apparatus for forming an image on an image receiving member using a photosensitive, pressure-sensitive recording medium having a surface coated with an immense number of microcapsules encapsulating a coloring material therein, comprising:
    exposure means for exposing the recording medium to an imaging light to form a latent image thereon;
    depositing means for depositing powders on the latent image formed recording medium, the powders being in cooperation with the coloring material to produce a visible image, said depositing means comprising conveying means for conveying the powders to the latent image formed recording medium, said conveying means having a surface for carrying the powders;
    pressure developing means for applying a pressure to the latent image formed recording medium, and for developing the latent image with the aid of the powders deposited thereon and producing an image on the surface of said conveying means; and
    thermal transfer means for heating at least one of said conveying means and the image receiving member to transfer the visible image from the surface of said conveying means to the image receiving member.

12. The image forming apparatus according to claim 11, wherein said conveying means comprises an endless belt partially in surface contact with the recording medium.

13. The image forming apparatus according to claim 12, wherein said endless belt comprises a substrate having a surface, and a material having a releasing or parting property weaker than the recording medium, the material being coated on the surface of said substrate.

14. The image forming apparatus according to claim 11, wherein said coloring material is a chromogenic material and said powders are developing agent reactable with the chromogenic material.

15. The image forming apparatus according to claim 11, wherein said coloring material is a dye and said powders are any one of dye absorption agent, dye fixing acceleration agent, coloring acceleration agent and adhesive agent.

16. The image forming apparatus according to claim 11, wherein said coloring material is a pigment and said powders are any one of pigment absorption agent, pigment fixing acceleration agent, coloring acceleration agent and adhesive agent.

17. An image forming apparatus for forming an image on an image receiving member using a photosensitive, pressure-sensitive recording medium having a surface coated with an immense number of microcapsules encapsulating a coloring material therein, comprising:

exposure means for exposing the recording medium to an imaging light to form a latent image thereon;

conveying means for conveying a conveying member having a surface;

depositing means for electrostatically depositing powders on a selected one of the surfaces of the recording medium and the conveying member, the powders being in cooperation with the coloring material to produce a visible image;

pressure developing means for applying a pressure to the latent image formed recording medium, and for developing the latent image with the aid of the powders deposited on the selected one of the surfaces of the recording medium and the conveying member and producing an image on the surface of the conveying member; and thermal transfer means for heating at least one of the image receiving member and the conveying member to transfer the visible image on the surface of the conveying member to the image receiving member.

18. The image forming apparatus according to claim 17, further comprising first charging means for charging the powders to a first polarity, and second charging means for charging the conveying member to a second polarity opposite the first polarity.

19. The image forming apparatus according to claim 18, wherein the conveying member is made of a material selected from the group consisting of polyamide resin, polyacetals resin, and acrylic resin.

* * * * *